United States Patent [19]

Matsuoka

[11] Patent Number: 5,774,472
[45] Date of Patent: Jun. 30, 1998

[54] SEMICONDUCTOR MEMORY DEVICE CAPABLE OF REALIZING STABLE TEST MODE OPERATION

[75] Inventor: Hideto Matsuoka, Hyogo, Japan

[73] Assignee: Mitsubishi Denki Kabushiki Kaisha, Tokyo, Japan

[21] Appl. No.: 866,369

[22] Filed: May 30, 1997

[51] Int. Cl.$^6$ .................................................. G06F 11/00
[52] U.S. Cl. ............................................................ 371/21.1
[58] Field of Search ................................ 371/21.1, 21.3, 371/21.4, 21.6; 365/200, 261, 210

[56] References Cited

U.S. PATENT DOCUMENTS 5,313,424  5/1994  Adams et al. ........................... 362/200
5,467,468  11/1995  Koshikawa .

FOREIGN PATENT DOCUMENTS 63-200262  8/1988  Japan .
2-67975    3/1990  Japan .
5-242698   9/1993  Japan .

*Primary Examiner*—Vincent P. Canney
*Attorney, Agent, or Firm*—McDermott, Will & Emery

[57] ABSTRACT

In a semiconductor memory device, in a normal operation, data is written to selected four memory cells in accordance with external write data DQ0 to DQ3 applied to four data input/output terminals. In test mode, same data is commonly written to the selected four memory cells in accordance with write data DQ applied to one data input/output terminal. In the test mode operation, signal transmission between the remaining three data input/output terminals and the corresponding input buffer circuits is cut off by a CMOS logic gate provided therebetween and controlled in accordance with a test mode designating signal /TE.

7 Claims, 11 Drawing Sheets

SEMICONDUCTOR MEMORY DEVICE CAPABLE OF REALIZING STABLE TEST MODE OPERATION

BACKGROUND OF THE INVENTION

1. Field of the Invention

The present invention relates to a semiconductor memory device, and more specifically, to a structure for realizing improved reliability of tests for semiconductor memory devices. More specifically, the present invention relates to a structure of a semiconductor memory device having a plurality of input/output pins in which test operation is possible by data writing and reading as well as input of a control signal through a special input/output pin during test mode operation.

2. Description of the Background Art

In intermediate test steps during wafer processing of semiconductor memory devices, for example in a pretest before laser trimming or in wafer test performed subsequently, it is necessary for a plurality of probes to be brought into contact with a corresponding plurality of pads of a semiconductor chip on the wafer.

FIG. 9 shows relation between such probes and pad arrangement on a semiconductor chip.

As storage capacity of a semiconductor memory device increases, data input/output has come to be done in multi-bit implementation. More specifically, as the bit width of data input/output at one time increases, the number of pads on the semiconductor memory device is ever increasing. Accordingly, the interval between pads becomes narrower, and it become more difficult to have probes be in contact with all the input/output pads.

Therefore, in the intermediate test step as mentioned above, it is desirable that the structure is adapted to allow test operation without the necessity of bringing the probes to be in contact with every input/output pad.

Meanwhile, as the storage capacity increases and the circuitry becomes more complicated in semiconductor memory devices, there are, at a certain rate, unavoidably chips having latent defects generated during the steps of manufacturing in the stage immediately before delivery.

More specifically, there may be latent defects of gate insulating film, latent defects of interlayer insulating film between interconnections, latent disconnection, latent leak defects between interconnections and latent defects caused by particles undesirably introduced during the steps of manufacturing, in the MOS transistors which constitute the semiconductor memory devices. If these chips having such latent defects are delivered as products, there would soon be malfunctions which are generally referred to as "initial failure mode."

Accordingly, it is a general practice to perform screening by a so-called "burn in" test in which semiconductor memory devices are operated under high temperature and high pressure condition to make apparent the aforementioned initial failure and to remove defective devices before delivery. Meanwhile, the time for "burn in" test becomes longer in proportion to the memory capacity even when only a simple write-read cycle is performed, and increase in test time directly results in increased chip cost.

Therefore, an approach has been made in which a plurality of semiconductor memory devices are arranged on a test board and multiple semiconductor memory devices are tested in parallel, so as to suppress increase in test time.

However, as already described, as the capacity of semiconductor memory devices has been ever increasing recently and data input/output structure has come to be implemented in multi-bit manner.

As a result, the number of semiconductor memory devices which can be tested simultaneously per one tester decreases and even when the parallel test approach is made, the test time inevitably increases, resulting in increased test cost.

A method of reducing test cost utilizing data bit compressing function has been proposed as a solution. More specifically, the semiconductor memory device is provided with a function of performing comparison·coincidence detection between a plurality of read data in the semiconductor memory device, and a determination signal is output from the semiconductor memory device to a specific input/output terminal. By this method, test mode operation in which the number of input/output terminals viewed from the tester is apparently reduced becomes possible. The number of semiconductor memory devices which can be measured simultaneously per test is not decreased when such structure is utilized.

Therefore, in the semiconductor memory device having the aforementioned data bit compressing function, it is not necessary to apply data to every one of the plurality of data input/output pads in the test mode. Accordingly, when a semiconductor memory device having a ×4 configuration is to be tested as having a ×1 configuration, data have only to be supplied to one of the plurality of data input/output pads to perform intermediate test in the wafer process.

FIG. 10 is a schematic block diagram showing a structure of a conventional semiconductor memory device 301 having the above described data bit compressing function.

In read operation in the memory operation mode, data stored in specific memory cells selected from a memory cell array 15 in accordance with external address signals A0 to Ai applied to an address signal input terminal 8 are amplified by sense amplifiers 14 and 16, and output as internal read data q0 to q3 to an internal data bus by I/O circuits 14 and 16.

Input/output buffer circuits 61 to 64 include switch circuits 91 to 94 for switching state of connection with external input/output terminals 65 to 68 respectively to either one of the following two states.

More specifically, switch circuits 91 to 94 connect input/output buffer circuits 61 to 64 individually to input/output terminals 65 to 68 in the normal operation mode in response to a test mode designating signal TE generated by a control signal generating circuit 11. More specifically, the switch circuits 91 to 94 are connected to the sides represented by the solid lines in FIG. 10.

Accordingly, output buffer circuits 61 to 64 receive internal read data q0 to q3 read from four memory cells respectively, generate external read data DQ0 to DQ3, and output the data to input/output terminals 65 to 68, respectively.

In writing operation in the normal operation mode, input/output buffer circuits 61 to 64 receive external write data DQ0 to DQ3 applied to external input/output terminals 65 to 68, respectively, and outputs data to four memory cells selected by external address signals A0 to Ai through I/O circuits 14 and 16, in the operation reverse to the reading operation described above.

Meanwhile, control signal generating circuit 11 receives write enable signal EXTW, output enable signal EXT./OE, row address strobe signal EXT./RAS and column address strobe signal EXTCAS, which are external control signals, detects the fact that a test mode (for example, the burn in test mode) is designated, and outputs an active test mode designating signal TE.

In response to activation of the test mode designating signal TE, switch circuits 91 to 94 commonly connect input/output buffer circuits 61 to 64 to a specific input/output terminal, for example, input/output terminal 65. More specifically, in FIG. 10, switches 91 to 94 are set to the state of connection represented by the dotted lines.

Therefore, in the writing operation in the test mode, the write data applied to input/output terminal 65 is applied to four memory cells selected by external address signals A0 to Ai commonly through I/O circuits 14 and 16.

In the reading operation in the test mode, internal read signals q0 to q3 from four memory cells selected by the external address signals A0 to Ai are input to a logic composition circuit 47, and logic composition circuit 47 determines coincidence (consistency) of these signals.

The logic composition circuit 47 outputs a determination signal TMq0 in accordance with the result of determination of coincidence (consistency) of input data, to input/output terminal 65.

Therefore, in the test mode operation, data input/output is performed only through the input/output terminal 65. In other words, the semiconductor memory device which has a ×4 configuration in normal operation can be tested as having a ×1 configuration.

Therefore, even when input/output structure of a semiconductor memory device is implemented in multi-bit manner, the number of semiconductor memory devices which can be tested in parallel simultaneously by one tester is not reduced.

FIG. 11 shows arrangement of probes and a semiconductor chip when the probes are brought into contact with input/output pads in an intermediate test during wafer processing, for the semiconductor memory device having the data bit compressing function.

As already described, in this structure, only that pad which corresponds to the external input/output data DQ0 has to be used as the pad for data input/output. Therefore, it is not necessary to bring the probes into contact with the pads corresponding to other data DQ1 to DQ3. Therefore, there would be a margin in the interval between the probes.

It goes without saying that when a semiconductor memory device having a ×16 configuration in normal operation is to be tested as having a ×4 configuration in the test mode operation in the step of intermediate test, it is possible to further reduce the number of probes necessary for the test operation to provide margin in the interval between the probes.

FIG. 12 is a schematic block diagram showing a structure of an input first stage buffer circuit provided corresponding to the data input/output pads.

Their input first stage buffer circuit 500 includes an NAND circuit 510 having one input node receiving an external input data DQi from a corresponding input/output pad and the other input node fixed at a power supply potential Vcc, and an inverter 520 receiving an output from NAND circuit 510, inverts it and outputs it as an internal write data Qi.

More specifically, as NAND circuit 510 has one input node fixed at the power supply potential Vcc, it equivalently operates as an inverter circuit.

FIG. 13 is a circuit diagram showing in greater detail the structure of the input first stage buffer circuit 500 shown in FIG. 12.

NAND circuit 510 includes p channel MOS transistors 512 and 514 connected in parallel between an output node OUT1 and a node to which the power supply potential Vcc is supplied, and N channel MOS transistors 516 and 518 connected in series to each other between output node OUT1 and a ground potential GND. P channel MOS transistor 514 and N channel MOS transistor 516 both have their gates connected to an input node IN1, and the power supply potential Vcc is supplied to input node IN1.

Meanwhile, P channel MOS transistor 512 and N channel MOS transistor 518 both have their gates connected to an input node IN2 and a corresponding external write data DQi is applied to input node IN2.

Inverter 520 includes a P channel MOS transistor 522 and an N channel MOS transistor 524 connected in series between power supply potential Vcc and the ground potential GND. Transistors 522 and 524 both have their gates connected to an input node IN3, and input node IN3 is connected to output node OUT1 of NAND circuit 510.

A connection node of transistors 522 and 524 is connected to an output node OUT2, and internal write data qi is output from output node OUT2.

Here, as already described, assume that a probe is not brought into contact with an input/output pad which corresponds to the input node IN2 of the input first stage buffer circuit shown in FIG. 13, because of the data bit compressing function, in the intermediate test of wafer processing.

In this case, the potential level at input node IN2 is electrically floating.

Therefore, the potential level of node IN1 has an unstable value. Therefore, when the input node IN1 is charged to be not lower than the ground potential GND by some cause and attains to the potential level of ½ Vcc, N channel MOS transistor 518 cannot be maintained at perfectly cut off state.

If input node IN2 is at such a potential level, P channel MOS transistor 512 is not completely cut-off, either. N channel MOS transistor 516 has its gate potential fixed at the power supply potential Vcc and is conductive. Accordingly, from power supply potential Vcc to the ground potential GND, there is formed a current leak path through P channel MOS transistor 512, N channel MOS transistor 516 and N channel MOS transistor 518. Therefore, in the step of intermediate test, for example, when characteristic of a small current value such as consumption current in a standby state of the semiconductor memory device is to be measured, the measured value may not be stabilized to a constant value, or the actually measured value may not represent the inherent performance of the semiconductor memory device.

Such problems are encountered not only in the semiconductor memory device having the data bit compressing function described above but also in a semiconductor memory device having dual port structure when only one of the port is to be tested in the step of intermediate test, as there is a data input/output pad which is not in contact with the probe.

SUMMARY OF THE INVENTION

An object of the present invention is to provide a semiconductor memory device allowing reduction in number of pads which require supply of a control signal or data in test mode operation, in which fluctuation of consumption current in an input first stage buffer circuit connected to an input/output pad which is not brought into contact with the probe in test step during wafer processing is suppressed.

Another object of the present invention is to provide a semiconductor integrated circuit device which allows stable measurement of a small current value such as a consumption current in a standby state, in a test step during wafer processing.

A still further object of the present invention is to provide a semiconductor memory device allowing stable test operation in a test step during wafer processing of a semiconductor memory device having multi-bit compressing function even when data input/output pad to which data supply is made unnecessary by the data bit compressing function is opened.

Briefly stated, the present invention provides a semiconductor memory device including an operation mode detecting circuit, an internal circuitry, a plurality of input/output pads, a plurality of input/output buffer circuits and a CMOS logic gate. The operation mode detecting circuit detects designation of a prescribed test mode in accordance with an external control signal, and activates a test mode signal. The internal circuitry stores an externally applied data in response to an external control signal, outputs the stored data, and outputs data of a result of a prescribed process based on the data. The plurality of input/output pads receive external control signals or a plurality of data, and apply a plurality of data externally. The plurality of input/output buffer circuits are provided corresponding to input/output pads, buffer corresponding data or control signal applied externally and apply the buffered result to the internal circuitry, or buffer data applied from the internal circuitry and apply the buffered result to corresponding input/output pads. The plurality of input/output buffer circuits include a first input/output buffer circuit receiving data or control signal from the corresponding input/output pad no matter whether the operation mode is a prescribed test mode or not, and a plurality of second/input buffer circuits which do not receive data or control signal from the corresponding input/output pads when the operation mode is the prescribed test mode. The CMOS logic gate is provided corresponding to the second input/output buffer circuit, controlled by the test mode signal in the prescribed test mode, and cuts off signal transmission between input nodes of the second group of input/output buffer circuits and the corresponding input/output pads.

The present invention provides, in another aspect, a semiconductor memory device including a plurality of word lines, a plurality of bit line pairs, a plurality of memory cells, a memory cell selecting circuit, an operation mode detecting circuit, a plurality of input/output pads, a plurality of input/output buffer circuits and a CMOS logic gate. The plurality of bit line pairs cross the plurality of word lines. The plurality of memory cells are connected to word lines and bit lines and arranged in a matrix of rows and columns. The memory cell selecting circuit performs, in response to an external address signal, reading/writing operation of stored data from and to the corresponding memory cell. The operation mode detecting circuit detects designation of a prescribed test mode in accordance with an external control signal, and activates a test mode signal. The plurality of input/output pads receive a plurality of external input data, and applies a plurality of output data externally. The plurality of input/output buffer circuits are provided corresponding to the input/output pads, receive a plurality of input data and output the data to the memory cell selecting circuit in writing operation, and receive data from the memory cell selecting circuit and output the data to the corresponding input/output pads in reading operation. The plurality of input/output buffer circuits include a first input/output buffer circuit receiving input data no matter whether the operation mode is the prescribed test mode or not, and a plurality of second input/output buffer circuits which do not receive input data from the corresponding input/output pads when the operation mode is the prescribed test mode. The CMOS logic gate is provided corresponding to the second input/output buffer circuits, controlled by a test mode signal in the prescribed test mode, and cuts off signal transmission between the input nodes of the second input/output buffer circuits and the corresponding input/output pads.

Therefore, a main advantage of the present invention is that even when there is an input/output pad which does not contact the probe in a test operation during wafer processing, generation of a through current in the CMOS circuit receiving the input data from the input/output pad can be suppressed.

Another advantage of the present invention is that measurement of a small consumption current in a standby state or the like can be measured stably in a test mode operation during wafer processing.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
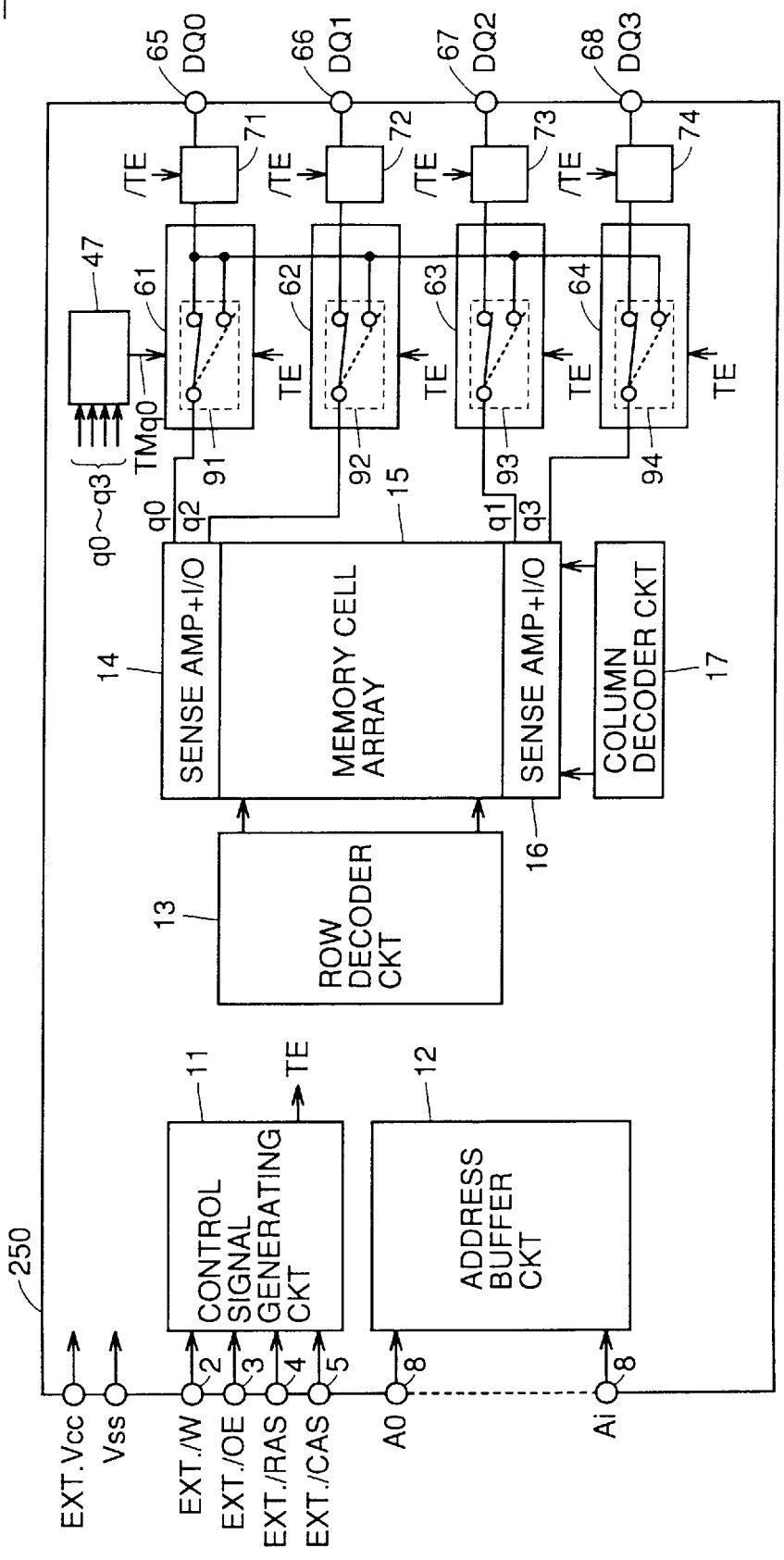
FIG. 1 is a schematic block diagram showing a structure of a semiconductor memory device 200 in accordance with the first embodiment of the present invention.

FIG. 1 is a schematic block diagram showing a structure of a semiconductor memory device 101 in accordance with one embodiment of the present invention.

Referring to FIG. 1, the semiconductor memory device 101 includes a control signal generating circuit receiving external control signals EXT./W, EXT./OE, EXT./RAS and EXT./CAS applied through external control signal input terminals 2 to 5 for generating internal control signals; a memory cell array 15 having memory cells arranged in a matrix of rows and columns; an address buffer circuit 12 receiving external address signals A0 to Ai applied through an address signal input terminal 8 for generating an internal row address signal and an internal column address signal under the control of control signal generating circuit 11; and a row decoder 13 which is activated under the control of control signal generating circuit 11 for decoding an external row address signal applied from address buffer 12 and for selecting a row (word line of memory cell array 15).

The signal EXT./W applied to external control signal input terminal 2 is a write enable signal for designating data writing. The signal EXT./OE applied to external control signal input terminal 3 is an output enable signal for designating data output. The signal EXT./RAS applied to external control signal input terminal 4 is a row address strobe signal for starting internal operation of semiconductor memory device 101 and for determining active period of the internal operation. When the signal EXT./RAS is active, circuits related to the operation of selecting a row of memory array 15 such as row decoder 13 are activated. The signal EXT./CAS applied to external control signal input terminal 5 is a column address strobe signal for activating circuits for selecting a column in memory cell array 15.

Control signal generating circuit 11 generates internal row strobe signal int.RAS in response to the external row strobe signal EXT.RAS, internal column strobe signal int.CAS in response to external column strobe signal EXT./CAS, internal write enable signal WBE in response to external write enable signal EXT./WE, and internal output enable signal OEM in response to external output enable signal EXT./OE.

Semiconductor memory device 101 further includes a column decoder circuit 17 which is activated under the control of control signal generating circuit 11 for decoding the internal column address signal from address buffer circuit 12 and for selecting a column of memory cell array 15; a sense amplifier for detecting and amplifying data of a memory cell connected to the selected row of memory cell array 15; an I/O circuit responsive to a column selection signal from column decoder 15 for connecting the selected column of memory cell array 15 to an internal data bus; input first stage buffer circuits 71 to 74 for receiving, under the control of control signal generating circuit 11, external input data DQ0 to DQ3 applied to the corresponding data input/output terminals 65 to 68; and input/output buffer circuits 61 to 64 receiving outputs from input first stage buffer circuits 71 to 74, respectively, and for outputting these to corresponding internal data buses.

The semiconductor memory device 101 further includes a logic composition circuit 47 controlled by control signal generating circuit 11 which, in test mode operation, receives internal read signals q0 to q3 from four memory cells selected by external address signals A0 to Ai, determines coincidence (consistency) of these signals and outputs determination signal TEMq0, as in the conventional semiconductor memory device 201.

In FIG. 1, input/output buffer circuits 61 to 64 are controlled by signal TE output from control signal generating circuit 11, and in normal data writing operation, provide output data from corresponding input first stage buffer circuits 71 to 74 to corresponding internal data buses, respectively, and in the test operation mode, all the input/output buffer circuits 61 to 64 commonly provide the similar output from input first stage buffer circuit 71 to the corresponding internal data buses, in response to the signal DQ0 applied to data input/output terminal 65.

In the structure shown in FIG. 1, for the simplicity of description, a structure is shown in which data applied through data input/output terminals 65 to 68 are supplied to internal data buses respectively. However, input/output buffer circuits 61 to 64 have such a structure in that data read from selected memory cells to corresponding internal data buses are output to corresponding data input/output terminals 65 to 68, respectively.

In FIG. 1, the sense amplifier and the I/O circuit are represented generally by one block 14 or 16.

Input/output buffer circuits 61 to 64 are activated in accordance with activation (change to the "H" level) of the internal output enable signal OEM generated by control signal generating circuit 11 in response to the external output enable signal EXT./OE in the reading operation, and is activated in accordance with activation of the internal write enable signal WBE generated by the control signal generating circuit 11 in response to the external write enable signal EXT./WE in the writing operation.

Though not specifically limited, the control signal generating circuit 11 receives external control signals EXT./W, XT./OE, EXT./RAS and EXT./CAS and detect the fact that a test mode (for example, burn in mode) is designated, and activates the test mode detection signal TE (set to "H" level state). At this time, the external control signals EXT./WE, EXT./OE, EXT./RAS and EXT./CAS may be adapted to the so-called WCBR condition (in which signals EXT./W and EXT./CAS are both activated ("L" level) before activation of the signal EXT./RAS ("L" level)).

Figure 2:
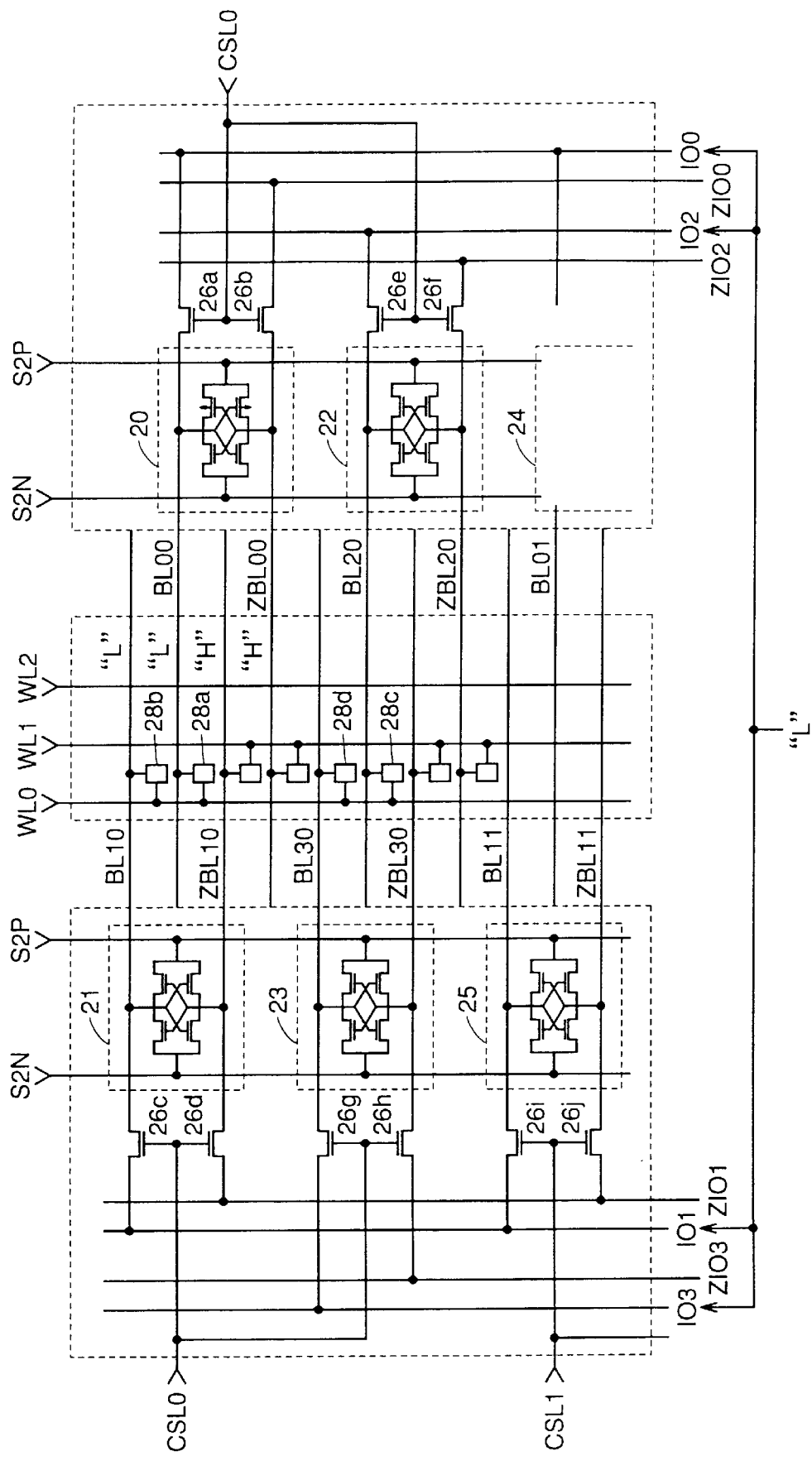
FIG. 2 is a circuit diagram showing a structure of a memory cell and a sense amplifier portion of a semiconductor memory device 100.

FIG. 2 is, though not specifically limited, a circuit diagram showing an example of memory cell array 15 and sense amplifier +I/O 14 and of semiconductor memory device 101 having the data bit compressing function.

Referring to FIG. 2, sense amplifiers 20, 22 and 24 and sense amplifiers 21, 23 and 25 are arranged on opposing sides with bit line pairs placed in between, and bit lines connected to opposing sense amplifiers are arranged alternate to each other. More specifically, between a pair of bit lines BL00 and ZBL00 connected to sense amplifier 20, bit line ZBL10 of the pair of bit lines BL10 and ZBL10 connected to sense amplifier 21 is placed.

The pair of bit lines BL00 and ZBL00 are respectively connected to internal data buses IO0 and ZIO0 through N channel MOS transistors 26a and 26b, respectively. Bit line pairs BL10 and ZBL10, BL20 and ZBL20 and BL30 and ZBL30 are also connected to internal data buses I01 and ZIO1, IO2 and ZIO2 and IO3 and ZIO3 through N channel MOS transistors 26c and 26d, 26e and 26f, and 26g and 26h, respectively.

Gate potentials of N channel MOS transistors 26a to 26h are controlled by the same column selection signal CSL0.

Sense amplifier 20 is connected to bit line pair BL00 and ZBL00, and amplifying potential difference between the pair of bit lines in accordance with a power supply potential supplied from sense amplifier control lines S2N and SNP. Sense amplifiers 21, 22 and 23 connected to bit line pairs BL10 and ZBL10, BL20 and ZBL20 and BL30 and ZBL30 respectively, also amplify potential difference between the pair of bit lines to which they are connected, respectively.

Internal data buses IO0 and ZIO0 are connected to input/output buffer circuit 61 and transmit internal write signal q0. Similarly, internal data buses IO1 and ZIO1, IO2 and ZIO2 and IO3 and ZIO3 are connected to input/output buffer circuits 62, 63 and 64 and transmit internal write signals q1, q2 and q3, respectively.

At a cross point between word line WL0 and bit line BL00, a memory cell 28a is connected. At a cross point with bit line BL10, memory cell 28b is connected, at a cross point with bit line BL20, memory cell 28c is connected and at a cross point with bit line BL30, memory cell 28d is connected.

In writing operation in the normal operation mode, external write data DQ0 to DQ3 input from external terminals 65 to 68 are converted to complementary internal write signals in input/output buffer circuits 61 to 64 respectively, and transmitted to internal data buses IO0 and ZIO0 to IO3 and ZIO3. When a word line WL0, for example, is transmitted in accordance with external address signals A0 to Ai and internal data buses IO0 and ZIO3 are connected to corresponding bit line pairs respectively, in accordance with column selection signal CSL0, stored data in accordance with the data input to external input/output terminals 65 to 68 are written individually to memory cells 28a to 28d, respectively.

By contrast, in writing operation in the data bit compression operation, a complementary signal in accordance with the data DQ0 input to external input/output terminal 65, for example, is commonly transmitted to all the internal data buses IO0 and ZIO0 to IO3 and ZIO3 If the write data is at the "L" level, for example, and data is to be written to the memory cells 28a to 28d selected by word line WL0 and column selection signal CSL0, bit lines BL00 to BL30 connected to these memory cells all attain to the "L" level. Meanwhile, bit lines ZBL0 to ZBL30 which are paired with these bit lines attain to "H" level.

In this manner, in the test mode, it is possible to write the same data simultaneously to four memory cells in the above described example, only by applying data DQ0 to data input/output terminal 65.

In the foregoing, an example has been described in which data writing of ×1 configuration is possible in a test mode in a semiconductor memory device having a so-called ×4 configuration. However, as will be apparent from the following description, the present invention is not limited to such an example. The present invention is also applicable to data bit compressing operation of other word configuration, for example in a semiconductor memory device having a ×16 configuration in normal operation for enabling data writing of ×4 configuration in the test mode.

Further, the present invention is applicable not only to a case where there is a data input/output terminal to which data input is unnecessary in the test mode of a plurality of data input terminals, but also to such a case where there is an input/output terminal to which input of a control signal is unnecessary in the test mode, of input/output terminals to which control signals are input.

Input buffer circuits 31a, 31b, 31c and 31d are included in input buffer circuits 61, 62, 63 and 64 shown in FIG. 1, respectively. The structure of input buffer circuit 31a is basically the same as those of input buffer circuits 31b to 31d. Therefore, in the following, mainly the structure and operation of input buffer circuit 31a will be described.

Data applied to input/output terminals 65 to 68 are transmitted to corresponding input buffer circuits 31a, 31b, 31c and 31d through input first stage circuits 71 to 74, respectively.

More specifically, input first stage buffer circuit 71 receives external write data DQ0 applied to data input/output terminals 65, and outputs internal write data DQ0.

Input first stage buffer circuits 72 to 74 receive external write data DQ1 to DQ3 applied to corresponding data input/output terminals 66 to 68, and output internal write data DQ1 to DQ3, respectively.

Input first stage buffer circuit 71 includes an NAND circuit 712 having one input node connected to data input/output terminal 65 and the other input node having its potential level fixed at the power supply potential Vcc, and an inverter 714 receiving an output from NAND circuit 712 for outputting an internal write data dq0.

Input first stage buffer circuit 72 includes an NAND circuit 722 having one input node connected to corresponding data input/output terminal 66 and receiving at the other input node a signal /TE which is an inverted signal of test mode designating signal TE, and an inverter circuit 724 receiving an output from NAND circuit 722.

Input first stage buffer circuits 73 and 74 have similar structure as input first stage buffer circuit 72 except that these correspond to different data input/output terminals and different input buffer circuits.

Input buffer circuit 31a includes a switch circuit 311 for switching half of input data in accordance with test node designating signal TE, and an input control circuit 321 controlled by internal write enable signal WBE and receiving an output from switch circuit 311 for outputting complementary internal write data to internal data buses IO0 and ZIO0.

Switch circuit 311 includes a clock inverter circuit 312 receiving the signal dq0, controlled by test mode designating signal TE and activated when the signal TE is at the "L" level, a clock inverter circuit 313 receiving the signal dq0, controlled by the test mode designating signal TE and activated when the signal TE is at the "H" level, and an inverter circuit 314 receiving test mode designating signal TE and outputting a control signal to clock inverter circuits 312 and 313.

Input control circuit 321 includes an inverter circuit 322, NAND circuits 323 and 324, inverter circuits 325, 326, and N channel MOS transistors Q1, Q2, Q3 and Q4.

NAND circuit 323 receives internal write enable signal WBE and an output from switch circuit 311. Inverter circuit 325 receives an output from NAND circuit 323. Inverter circuit 322 receives an output from switch circuit 311, and NAND circuit 324 receives internal write enable signal WBE and an output from inverter circuit 322. Inverter circuit 326 receives an output from NAND circuit 324. N channel MOS transistors Q1 and Q2 are connected in series between the power supply potential which corresponds to the "H" level and the ground potential which corresponds to the "L" level, and N channel MOS transistors Q3 and Q4 are also connected in series between the power supply potential and the ground potential.

Gates of N channel MOS transistors Q1 and Q4 are connected to an output of inverter circuit 325. Gates of N channel MOS transistors Q2 and Q3 are connected to an output of inverter circuits 326. A node between N channel MOS transistors Q1 and Q2 is connected to internal data bus IO0 and a node between N channel MOS transistors Q3 and Q4 is connected to internal data bus ZIO0.

The operation of the input buffer circuit 31a will be described.

First, normal operation mode, in which test mode designating signal TE is at "L" level, will be described.

In this case, in switch circuit 311, clock inverter circuit 312 is active and inverts and outputs the input signal, while clock inverter circuit 313 is inactive. Therefore, connection between output from inverter 714 and input control circuit 321 is cut off.

When signal DQ0 is at the H level, for example, the output from clock inverter circuit 312 is "L" level.

While the internal write enable signal WBE is inactive ("L" level state), output from NAND circuits 323 and 324 are both at "H" level and output of inverter circuits 325 and 326 are "L" level, regardless of the level of the output signal from switch circuit 311.

Accordingly, N channel MOS transistors QA1 to Q4 are all cut off, and internal data buses IO0 and ZIO0 are both at the high impedance state.

By contrast, when internal write enable signal WBE is activated ("H" level state), the output from NAND circuit 323 attains to the "H" level and the output of NAND circuit 324 attains to the "L" level, as the output signal of clock inverter circuit 312, which is the output of switch circuit 311, is at the "L" level as described above.

Therefore, the output from inverter circuit 325 attains to the "L" level, and N channel MOS transistors Q1 and Q4 are cut off.

Meanwhile, the output of inverter circuit 326 is at "H" level, and N channel MOS transistors Q2 and Q3 are rendered conductive. Therefore, internal data bus IO0 attains to "H" level and internal data bus ZIO0 attains to "L" level. More specifically, corresponding to the fact that the signal dq0 is at "H" level, potentials of internal data buses IO0 and ZIO0 change.

The operation of input buffer circuit 31a in the test mode state, that is, when test mode designating signal TE is at the active state ("H" level state) will be described.

In this case, in switch circuit 311, clock inverter circuit 312 is inactive, and clock inverter circuit 313 attains to the active state. Therefore, the output dq0 of inverter circuit 314 is connected to input control circuit 321.

More specifically, in the test mode state also, in accordance with the write data DQ0 applied to data input/output terminal 65, internal write data dq0 is generated and accordingly, potential levels of internal data buses IO0 and ZIO0 are driven.

By contrast, the operation of input buffer circuit 31b is as follows.

Namely, in the normal operation mode, the signal /TE which is an inverted signal of test mode designating signal TE is at the "H" level, and the operation of the NAND circuit 722 of input first stage buffer circuit 72 is similar to the operation of NAND circuit 712 of input first stage buffer circuit 71.

Therefore, corresponding to the external write data DQ1 applied to data input/output terminal 66, in accordance with internal write data dq1 output from inverter circuit 724 of input first stage buffer circuit 72, input buffer circuit 31b drives the potential levels of corresponding internal data buses IO2 and ZIO2.

By contrast, in the test mode state, input buffer circuit 31 drives potential levels of corresponding internal data buses IO2 and ZIO2 in accordance with the internal write data dq0 output from input first stage buffer circuit 71 in accordance with the external write data DQ0. Similarly, in input buffer circuit 31c and 31d, in normal operation mode, potentials levels of corresponding internal data buses IO1 and ZIO1 as well IO3 and ZIO3 are driven in accordance with internal write data dq2 and dq3 output from input first stage buffer circuits 73 and 74, in accordance with external write data DQ2 and DQ3 applied to corresponding data input/output terminals 67 and 68, respectively.

In the test mode state, input buffer circuits 31c and 31d drive potential levels of internal data buses IO1 and ZIO1 and IO3 and ZIO3, corresponding to internal write data DQ0 output from input first stage buffer circuit 71, in accordance with the write data DQ0 applied to data input/output terminal 65.

In this manner, in normal operation, internal data buses IO0 and ZIO0 to IO3 and ZIO3 have their potential levels driven in accordance with the external write data applied to the corresponding data input/output terminals, respectively, while in the test mode state, internal data buses IO0 and ZIO3 and IO3 and ZIO3 have their potential levels driven in accordance with external write data DQ0 applied to data input/output terminal 65.

In other words, common data can be written to selected four memory cells simply by applying write data to data input/output terminal 65.

Figure 3:
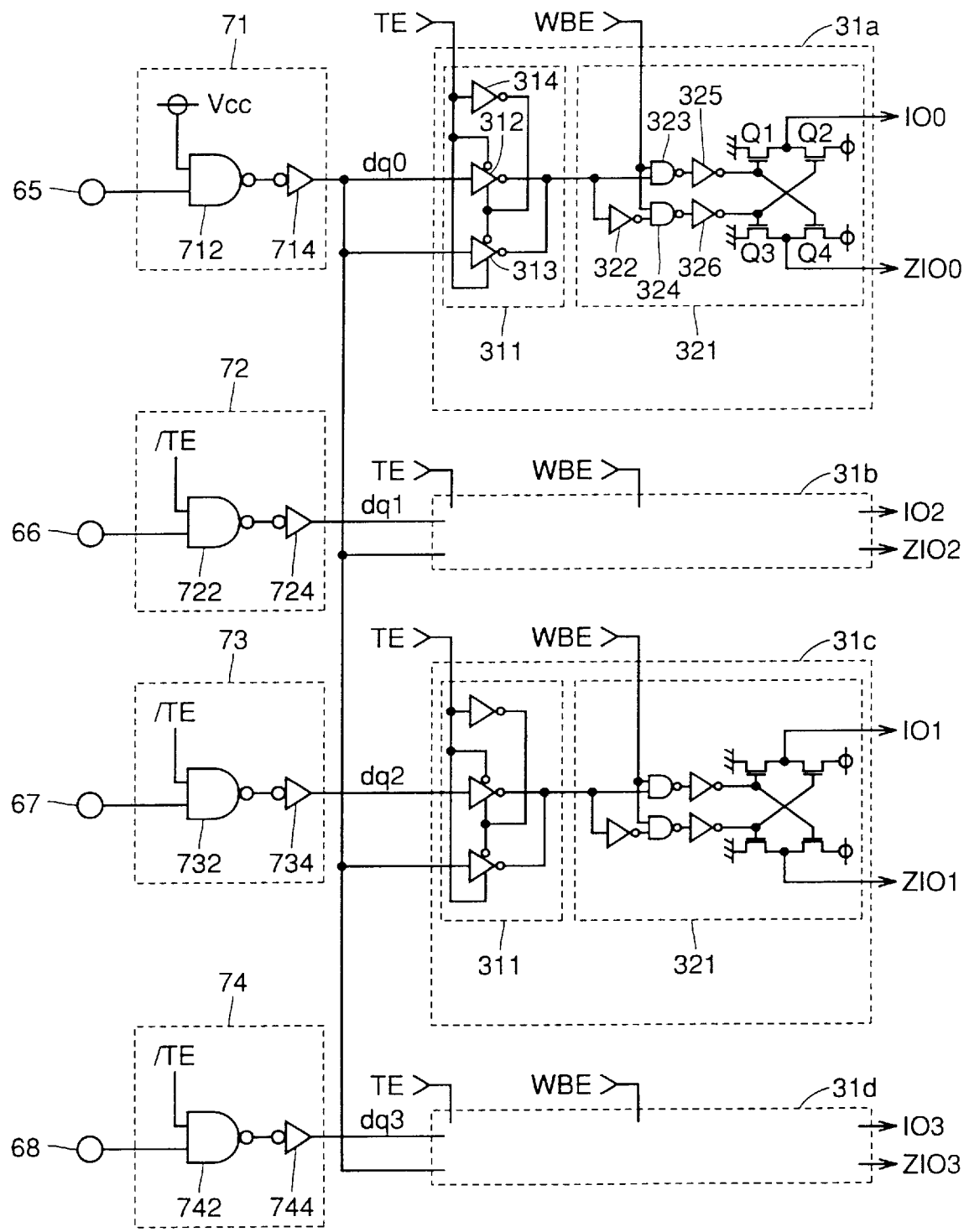
FIG. 3 is a circuit diagram showing a structure of an input buffer circuit of semiconductor memory device 100.
Figure 4:
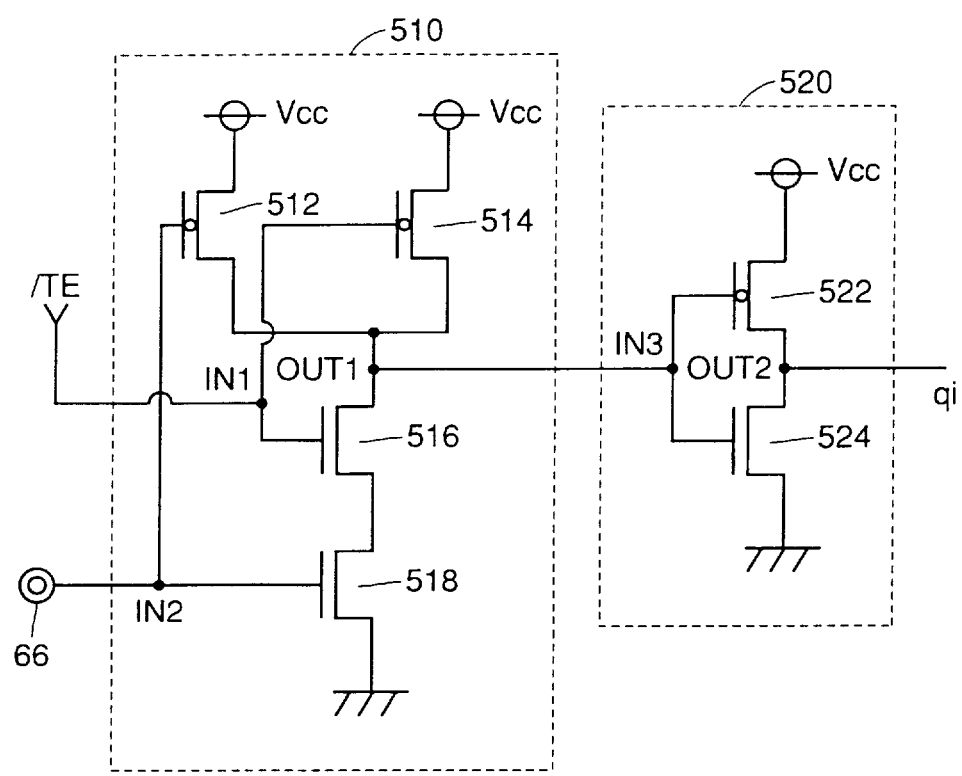
FIG. 4 is a circuit diagram showing a structure of an input buffer first stage circuit of the input buffer circuit shown in FIG. 3.

FIG. 4 is a circuit diagram showing, in greater detail, the structure of input first stage buffer circuit 72 shown in FIG. 3.

Figure 13:
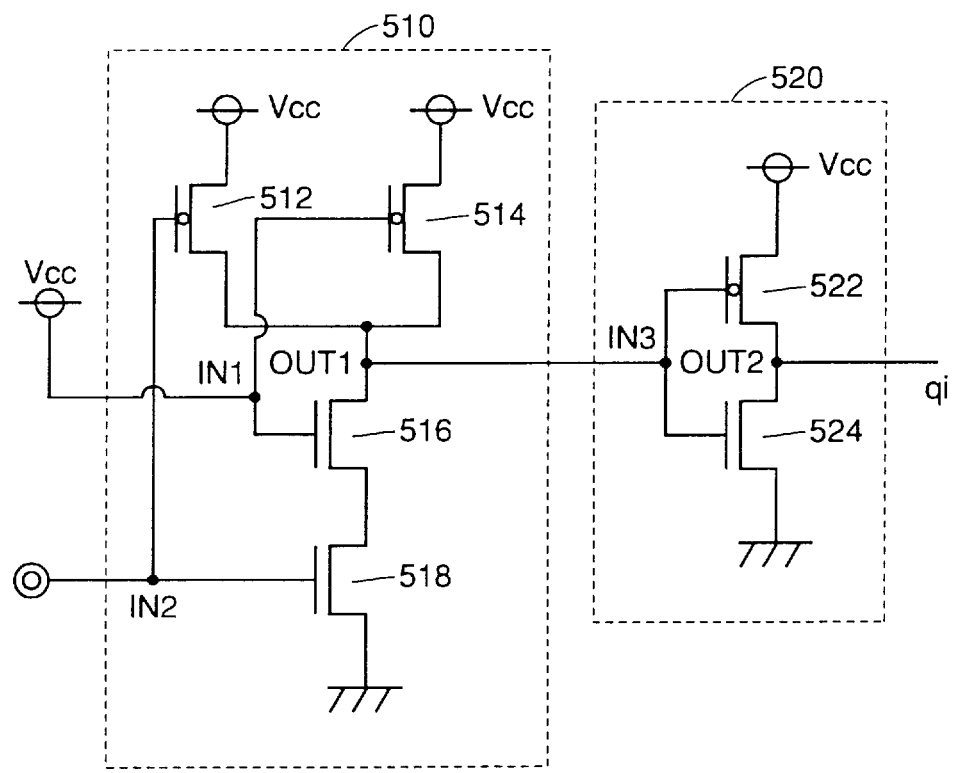
FIG. 13 is a circuit diagram showing in greater detail, the structure of the input first stage buffer circuit 500 shown in FIG. 12.

The structure of input first stage buffer circuit shown in FIG. 4 is similar to that of the conventional input first stage buffer circuit shown in FIG. 13 except that an inverted signal /TE of test mode designating signal TE is input to input node IN1, and therefore corresponding portions are denoted by the same reference characters and description thereof is not repeated.

The operation is as follows.

In the input first stage buffer circuit 72, in normal operation mode, the signal /TE is at "H" level, and therefore it operates in the similar manner as the conventional input first stage buffer circuit shown in FIG. 13.

By contrast, in the test mode state, the signal /TE attains to the "L" level. Therefore, N channel MOS transistor 516 is cut off.

Therefore, different from the conventional input first stage buffer circuit, even when the potential level of the corresponding data input/output terminal 66 is at ½ Vcc, there is not a through current from power supply potential Vcc to the ground potential GND generated in NAND circuit 722.

More specifically, even when both P channel MOS transistor 512 and N channel MOS transistor 518 are not completely off, there will never be a through current path, as N channel MOS transistor 516 is fixed to the off state.

The structure of the input first stage buffer circuit 71 is similar to that of the conventional input first stage buffer circuit shown in FIG. 13, and the structure of input first stage buffer circuits 73 and 74 is basically similar to that of input first stage buffer circuit 72.

Therefore, in the test mode, when probe is brought into contact only with data input/output terminal 65 while data input/output terminals 66 to 68 are not in contact with the probe but electrically floating, there is not a through current generated in the input first stage buffer circuits 72 to 74 which are connected to the data input/output terminals 66 to 68.

Therefore, in such a test mode, even when the number of probes is reduced to provide margin in the interval between the probes, small current value such as current consumption in the standby state can be measured stably.

Figure 5:
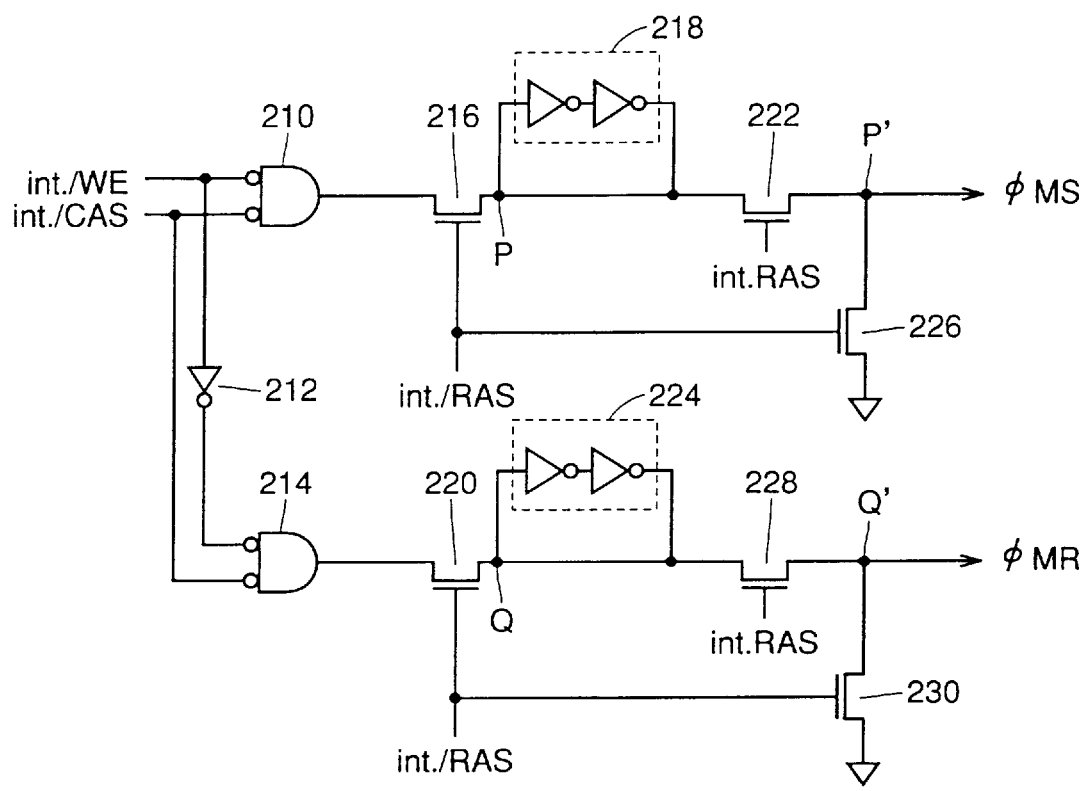
FIG. 5 is a first circuit diagram showing a structure of a control signal generating circuit 11 of semiconductor memory device 100.
Figure 6:
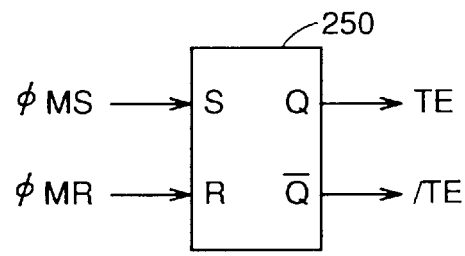
FIG. 6 is a second circuit diagram showing a structure of control signal generating circuit 11.

FIG. 5 is a circuit diagram showing a structure of an internal control circuit 200 outputting internal control signals $\phi_{MS}$ and $\phi_{MR}$ in response to externally applied signals EXT./W, EXT./RAS and EXT./CAS. FIG. 6 is a block diagram showing a structure of an S-R flipflop circuit 250 which activates or inactivates the test mode designating signal TE in accordance with signals $\phi_{MS}$ and $\phi_{MR}$.

Referring to FIG. 5, internal control circuit 200 includes an NOR circuit 210 receiving two signals, that is, a signal int./WE generated by control signal generating circuit 11 in response to signal EXT./W and the signal int./CAS generated in response to the signal EXT./CAS; an N channel MOS transistor 216 receiving at its gate the signal int./RAS generated in response to the signal EXT./RAS and having one of source and drain connected to an output of NOR circuit 210; a latch circuit 218 holding potential level of a node P of the other one of the source and drain of N channel MOS transistor 216; an N channel MOS transistor 222 receiving at its gate the signal int./RAS (inverted signal of int./RAS), having one of source and drain connected to node P and the other connected to a node P' outputting internal control signal $\phi_{MS}$; and an N channel MOS transistor 226 connected between node P' and the ground potential and receiving at its gate the signal int./RAS.

Internal control circuit 200 further includes an inverter 212 receiving signal int./WE; an NOR circuit 214 receiving signal int./CAS and an output from inverter 212: an N channel MOS transistor 220 having one of source and drain connected to an output of NOR circuit 214 and the other connected to a node Q; a latch circuit 224 for holding potential level of node Q; an N channel MOS transistor 228 receiving at its gate the signal int./RAS, one of source and drain connected to node Q and the other connected to a node Q' outputting signal $\phi_{MR}$; and an N channel MOS transistor 230 receiving at its gate the signal int./RAS and connected between node Q' and the ground potential.

Referring to FIG. 6, control signal generating circuit 11 further includes an S-R flip-flop circuit 250 receiving as a set signal, the signal $\phi_{MS}$ and as a reset signal, the signal $\phi_{MR}$, for outputting a test mode designating signal ET.

Figure 7:
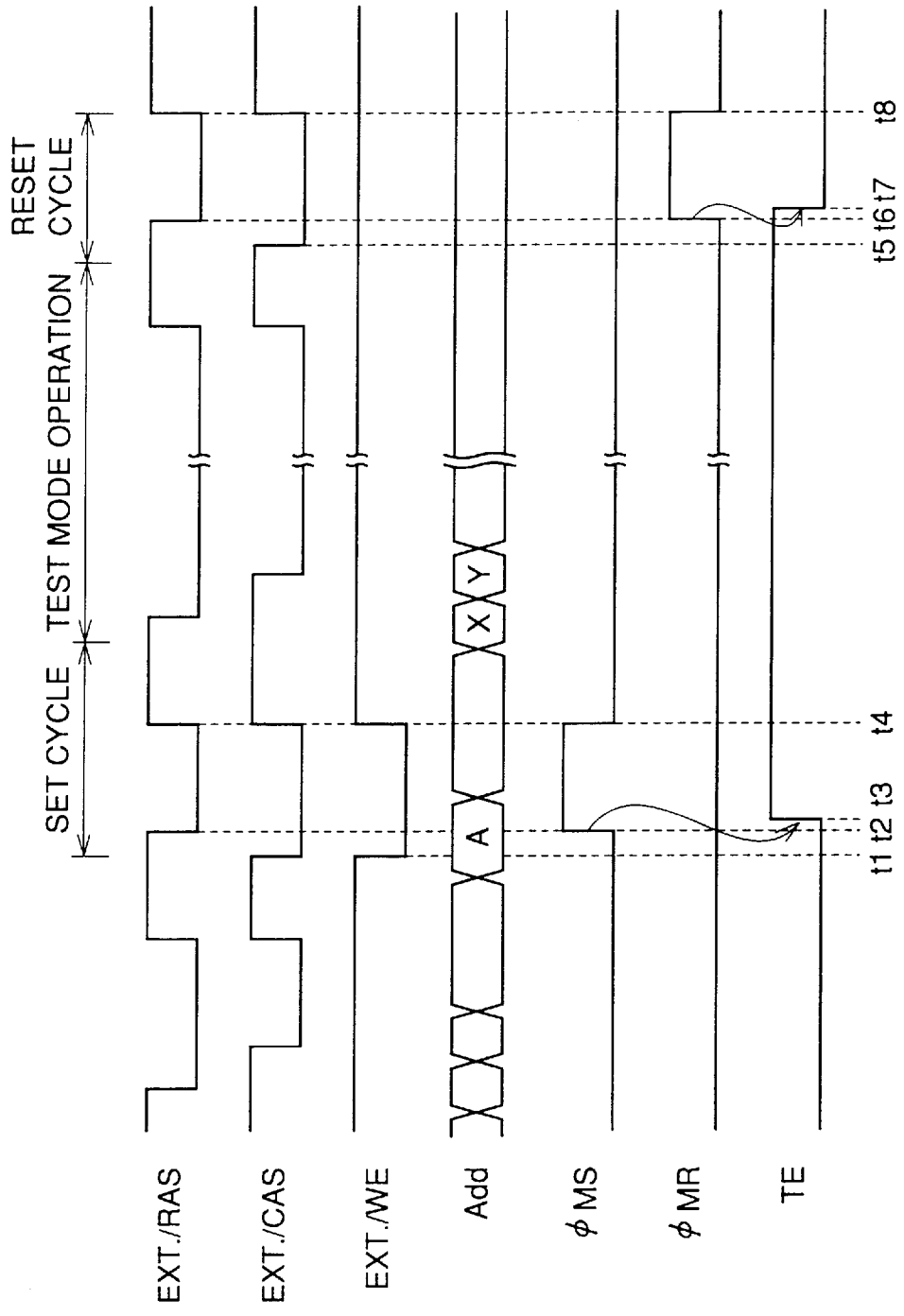
FIG. 7 is a timing chart showing the operation of control signal generating circuit 11.

The operation of internal control circuit 200 and S-R flip-flop circuit 250 will be briefly described. FIG. 7 is a timing chart showing the operation of internal control circuit 200 and S-R flip-flop circuit 250.

At time t1, signals ET/AS and EXT./WE fall from "H" level to "L" level. Thereafter, at time t3, signal EXT./AS also falls to the "L" level. Namely, the so-called WCBR condition is set.

In the period from time point t1 to t2, the output level of NOR circuit 210 is at "H" level, as the signals EXT./WE and EXT./CAS are both at the "L" level. In the period from t1 to t2, the signal EXT./RAS, that is, the signal int./RAS is at "H" level, and N channel MOS transistor 216 is conductive, and therefore the potential level at node P is also at the "H" level. The potential level is held by latch circuit 218.

Meanwhile, the potential level of node Q which is connected to the output node of NOR circuit 214 is at the "L" level, which potential level is held by latch circuit 224.

From time t1 to time t2, N channel MOS transistors 222 and 228 receiving at their gates the signal int./RAS (inverted signal of int./RAS) are both non-conductive, while N channel MOS transistors 226 and 230 receiving at their gates the signal int./RAS are conductive. Therefore, potential levels of nodes P' and Q' are both "L" level, and signals $\phi_{MS}$ and $\phi_{MR}$ are both at "L" level.

When the signal EXT./RAS falls from the "H" level to "L" level at time t2, N channel MOS transistors 216, 220, 226, 230 are all rendered non-conductive. By contrast, N channel MOS transistors 222 and 228 receiving at their gates the signal int.RAS (inverted signal of int./RAS) are both rendered conductive. Therefore, at time t3, the potential level of node P7 rises to the "H" level, and the potential level of node Q' is maintained at the "L" level.

More specifically, as shown in FIG. 7, the signal $\phi_{MS}$ changes to the "H" level at time t2.

Next, referring to FIG. 6, in response to the signal $\phi_{MS}$ attaining to "H" level, the test mode designating signal TE which is the output signal of S-R flipflop circuit 250 is set to the active level of "H" at time t3.

By the above described operation, test mode operation is designated, and in the test mode period, the level of the signal TE is kept at the "H" and the level of the signals /TE is kept at the "L" level.

At time t4, in response to the signal EXT./RAS attaining to "H" level, N channel MOS transistors 226 and 230 are both rendered conductive, and potential levels of nodes P' and Q', that is, the levels of signals $\phi_{MS}$ and $\phi_{MR}$ both attain to the "L" level.

Thus the set cycle for the test mode operation is completed.

Thereafter, in the test mode operation, for example, at the falling edge of the signal EXT./RAS to the "L" level, a row address is taken, and in response to the falling edge of the signal EXT./CAS, a column address signal is taken, and test operation is performed.

After the completion of test operation, reset cycle starts.

In the reset cycle, at time t5, the signal EXT./CAS falls to the "L" level, and thereafter, at time t6, the signal EXT./RAS falls to the "L" level.

Namely, the so-called CBR condition is set.

From time t5 to time t6, the potential level of the output node of NOR circuit 214 is at "H" level, and the output node of NOR circuit 210 is kept at the "L" level. As in the set cycle, in accordance with the potential level of output nodes of NOR circuits 210 and 214 in this period (from t5 to t6), signals $\phi_{MS}$ and $\phi_{MR}$ are output at the position of falling of the signal EXT./RAS at time t6.

More specifically, at time t6, the signal $\phi_{MS}$ is maintained at the "L" level while the signal $\phi_{MR}$ rises to the "H" level. In response, the output level of S-R flipflop circuit 250 is reset, and the test mode designating signal TE attains to "L" level at time t7.

At time t8, as the signals EXT./RAS and /CAS both return to the "H" level, the signal $\phi_{MR}$ also returns to the "L" level.

By the above described operation of the internal control circuit 200 and S-R flipflop circuit 250, it is possible to set the test mode designating signal TE and its inverted signal /TE to active or inactive state in accordance with the combination of external control signals.

In the foregoing, input first stage buffer circuits 71 to 74 have been described as including NAND circuits. However, the structure of the input first stage circuits 71 to 74 is not limited thereto, and other CMOS logic gate circuit may be used.

Figure 8:
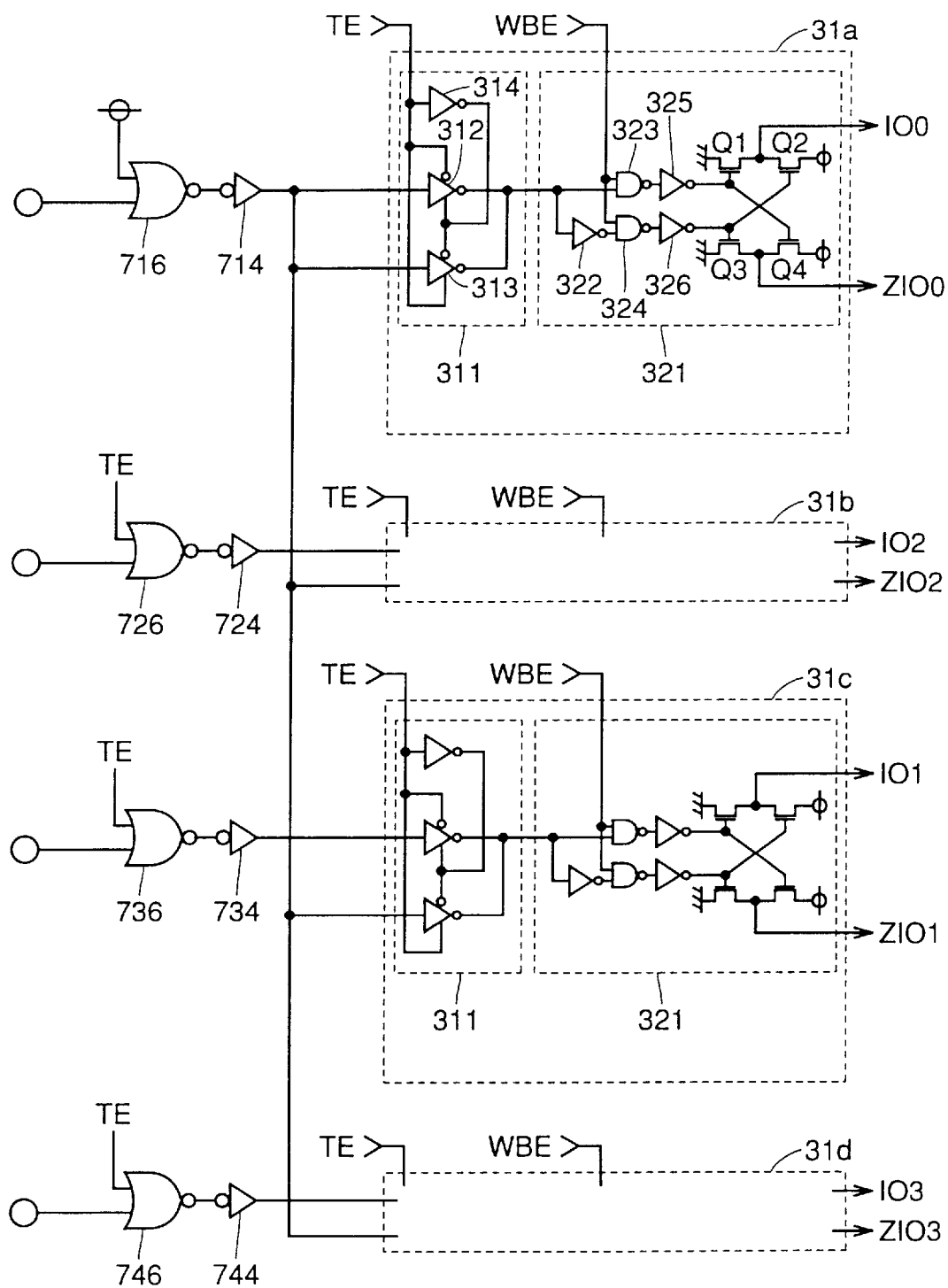
FIG. 8 is a circuit diagram showing a variation of an input buffer circuit of semiconductor memory device 100 in accordance with the present invention.
Figure 9:
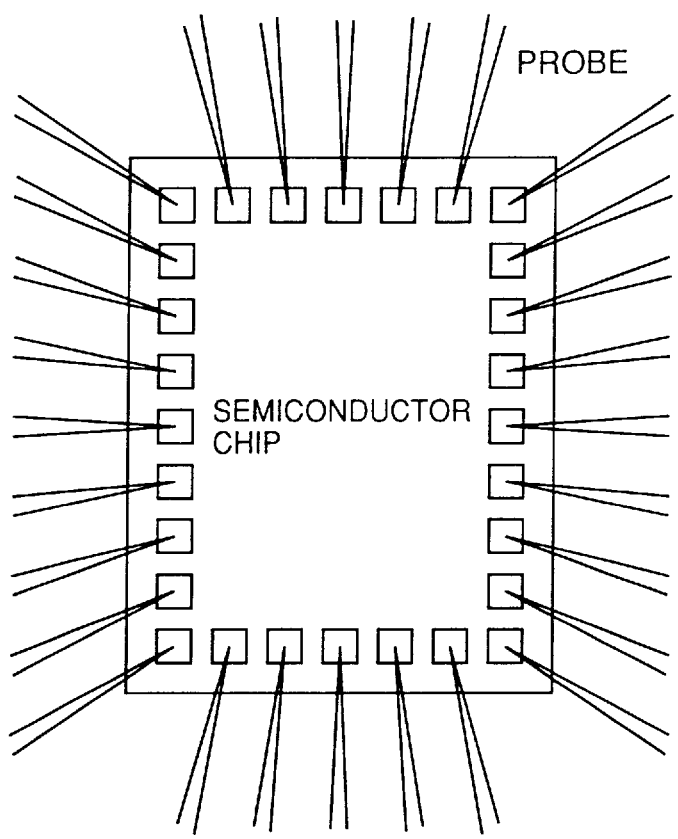
FIG. 9 shows arrangement of probes and input/output pads of a semiconductor chip in an intermediate test during wafer processing.
Figure 10:
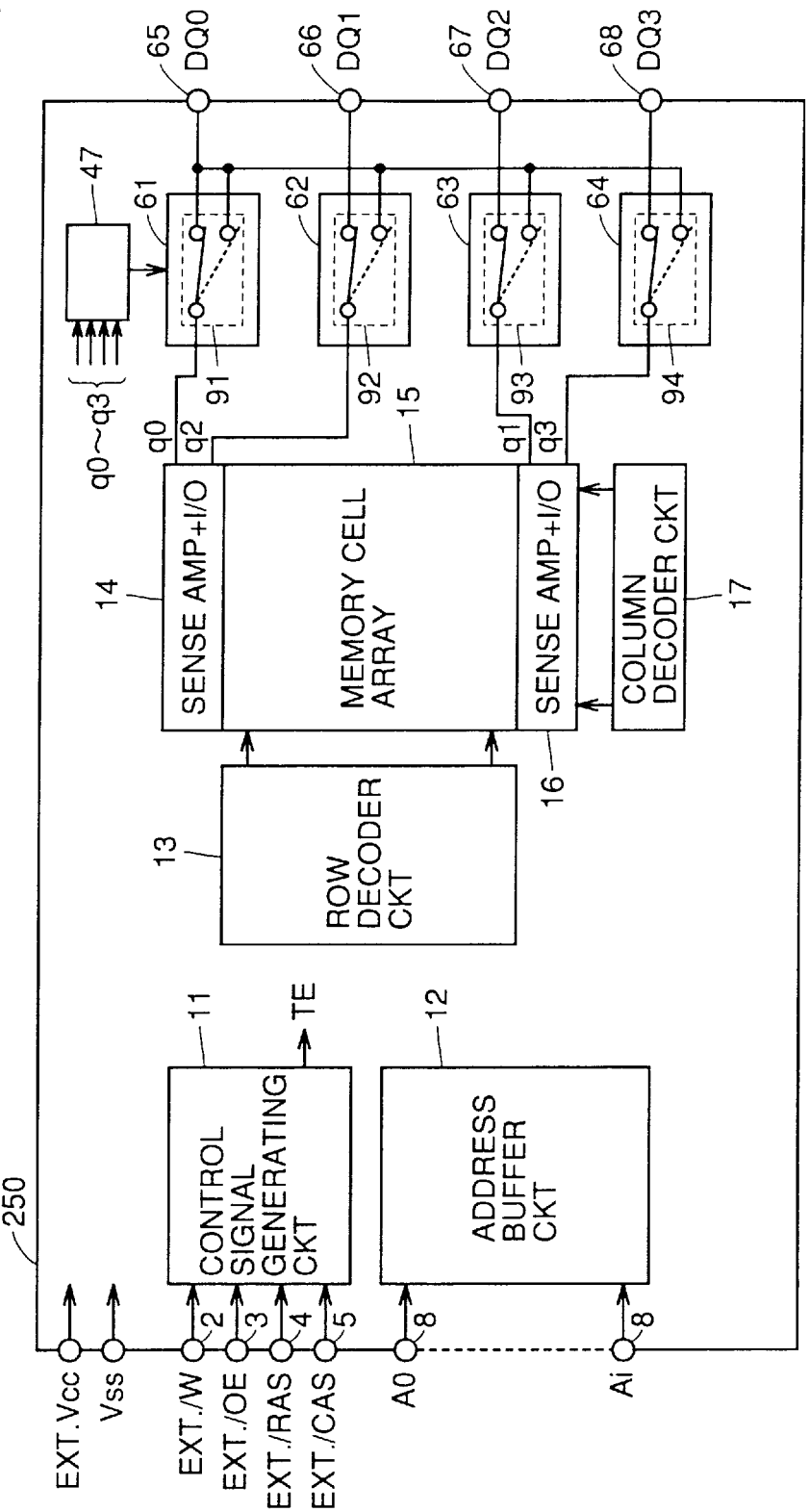
FIG. 10 is a schematic block diagram showing a structure of a conventional semiconductor memory device 301.
Figure 11:
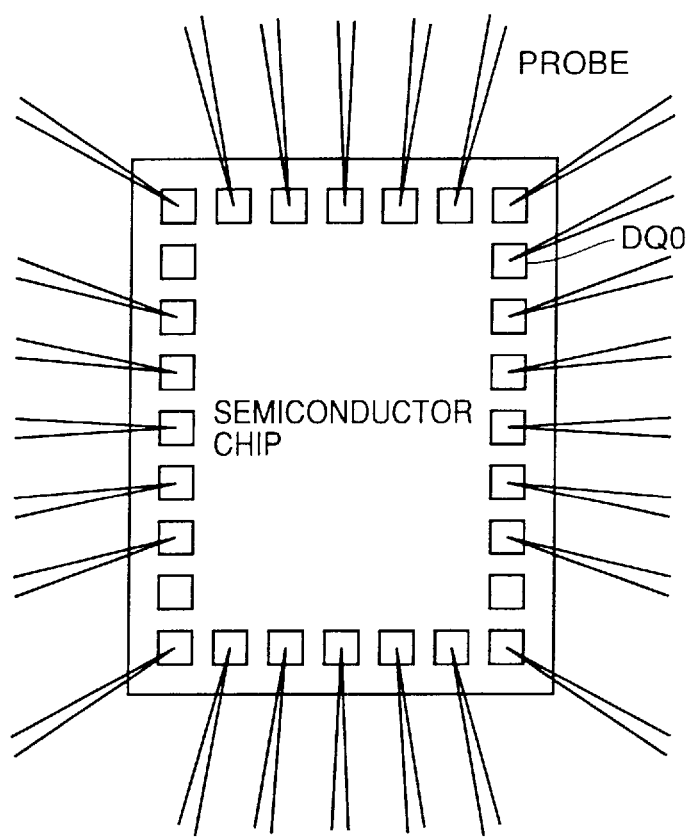
FIG. 11 shows relation between probes and pad arrangement of a semiconductor chip at the time of data bit compressing operation.
Figure 12:
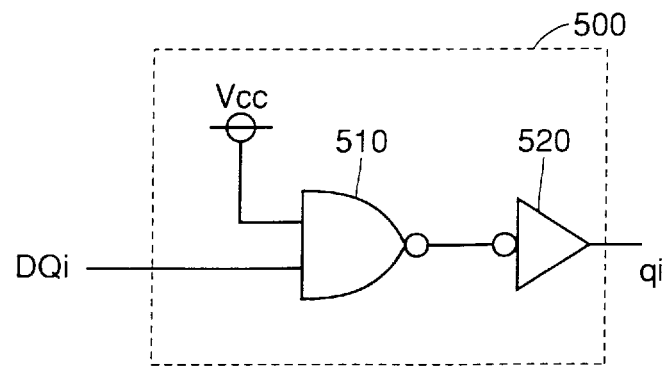
FIG. 12 is a block diagram showing a structure of an input first stage buffer circuit 500 of the conventional semiconductor memory device 301.

FIG. 8 is a circuit diagram showing a variation of the input first stage buffer circuit shown in FIG. 3.

Different from the input first stage buffer circuit shown in FIG. 3, the CMOS logic gate receiving as one input the external write data DQ0 to DQ3 applied from data input/output terminals 65 to 68 is an NOR circuit.

More specifically, the input first stage buffer circuit 71 provided corresponding to data input/output terminal 65 includes an NOR circuit 716 receiving at one input node the power supply potential Vcc and having the other input node connected to data input/output terminal 65, and an inverting circuit 74 receiving an output from NOR circuit 716 and inverting it to output internal write data DQ0.

The input first stage buffer circuit 72 provided corresponding to data input/output terminal 66 includes NOR circuit 726 receiving at one input node the test mode designating signal TE and the other input node connected to data input/output terminal 66, and an inverter 724 receiving an output from NOR 726, and inverting it to output internal write data dq1.

The structure of input first stage buffer circuits 73 and 74 provided corresponding to data input/output terminals 67 and 68 are basically the same as the structure of input first stage buffer circuit 72.

Similar effects as provided by the circuit shown in FIG. 3 can also be provided by such a structure.

Further, similar effects can be obtained provided that the CMOS logic gate used can cut off signal transmission between the corresponding data input/output terminal and the corresponding input buffer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

operation mode detecting means for detecting designation of a prescribed test mode in response to an external control signal, for activating a test mode signal;

an internal circuit responsive to an external control signal for storing an externally applied data, outputting stored data, and outputting data of a result of a prescribed process based on said data;

a plurality of input/output pads receiving said external control signal or a plurality of said data, or applying externally a plurality of data; and a plurality of input/output buffer means provided corresponding to said input/output pads, buffering and applying to said internal circuit the externally applied corresponding said data and the control signal, or for buffering and applying to corresponding said input/output pad the data applied from said internal circuit, said plurality of input/output buffer means including a first input/output buffer means receiving either said data or the control signal from corresponding said input/output pad no matter whether an operation mode is said prescribed test mode or not, and a plurality of second input/output buffer means not receiving said data or said control signal from corresponding said input/output pad when operation mode is said prescribed test mode;

said semiconductor memory device further comprising a plurality of CMOS logic gates provided corresponding to said second input/output buffer means respectively, controlled by said test mode signal in said prescribed test mode, each cutting signal transmission between an input node of corresponding said second input/output buffer means and corresponding said input/output pad.

2. The semiconductor memory device according to claim 1, wherein said CMOS logic gate is a 2-input NAND circuit receiving at one input node said test mode signal and having the other input node connected to the corresponding input/output pad.

3. The semiconductor memory device according to claim 1, wherein said CMOS logic circuit is a 2-input NOR circuit receiving at one input node said test mode signal, and having the other input node connected to the corresponding input/output pad.

4. A semiconductor memory device, comprising:

a plurality of word lines;

a plurality of bit line pairs crossing said plurality of word lines;

a plurality of memory cells arranged in a matrix and connected to said word lines and said bit lines;

memory cell selecting means responsive to an external address signal for performing reading/writing operation of stored data from and to corresponding said memory cell;

operation mode detecting means for detecting designation of a prescribed test mode in response to an external control signal for activating a test mode signal;

a plurality of input/output pads receiving a plurality of external input data respectively, for applying a plurality of output data externally, and a plurality of input/output buffer means provided corresponding to said input/output pads, receiving said plurality of input data and outputting these to said memory cell selecting means in writing operation, and receiving data from said memory cell selecting means and outputting these to corresponding said input/output pads in reading operation, said plurality of input/output buffer means including first input/output buffer means receiving said input data no matter whether an operation mode is said prescribed test mode or not, and a plurality of second input/output buffer means not receiving said input data from corresponding said input/output pad when the operation mode is said prescribed test mode;

said semiconductor memory device further comprising a plurality of CMOS logic gates provided corresponding to said second input/output buffer means respectively, controlled by said test mode signal in said prescribed test mode, each cutting signal transmission between an input node of corresponding said second input/output buffer means and corresponding said input/output pad.

5. The semiconductor memory device according to claim 4, further comprising:

switching means controlled by said test mode signal in said prescribed test mode for commonly applying input data applied to said first input buffer to said plurality of second input buffers; and multi-bit test means responsive to coincidence/non-coincidence of a plurality of read data read from memory cells to which common said input data has been written from said first and second input buffers, in reading operation in said prescribed test mode, for applying corresponding test result signal to said first input/output buffer means.

6. The semiconductor memory device according to claim 5, wherein said CMOS logic gate is a 2-input NAND circuit receiving at one input node said test mode signal and having the other input node connected to the corresponding input/output pad.

7. The semiconductor memory device according to claim 5, wherein said CMOS logic gate is a 2-input NOR circuit receiving at one input node said test mode signal and having the other input node connected to the corresponding input/output pad.

* * * * *